United States Patent [19]

Davis

[11] 3,911,296

[45] Oct. 7, 1975

[54] CAPACITANCE MULTIPLIER CIRCUIT

[75] Inventor: William Folsom Davis, Tempe, Ariz.

[73] Assignee: Motorola, Inc., Chicago, Ill.

[22] Filed: Oct. 7, 1974

[21] Appl. No.: 512,754

Related U.S. Application Data

[63] Continuation of Ser. No. 332,825, Feb. 15, 1973, abandoned.

[52] U.S. Cl. ............. 307/297; 307/235 R; 307/237; 328/167

[51] Int. Cl.² ............ H03K 1/12

[58] Field of Search ........ 307/237, 297, 235, 235 R; 328/167

[56] References Cited

UNITED STATES PATENTS

| | | | |
|---|---|---|---|
| 2,850,695 | 9/1958 | Bishop | 323/22 |
| 3,553,609 | 1/1971 | Edge | 333/80 |
| 3,657,575 | 4/1972 | Taniguchi et al. | 307/297 |
| 3,829,789 | 8/1974 | Mulder | 307/237 |

*Primary Examiner*—Michael J. Lynch
*Assistant Examiner*—Joseph E. Clawson, Jr.
*Attorney, Agent, or Firm*—Vincent J. Rauner; Charles R. Hoffman

[57] ABSTRACT

A capacitance multiplier circuit having first and second terminals adapted for use in integrated circuits. An NPN transistor has its emitter connected to the second terminal, its base connected to one electrode of a capacitor and its collector connected to the other electrode of the capacitor and also to the first terminal. Increasing the voltage of the first terminal causes a charging current to flow in the capacitor and into the base of the transistor. The capacitor charging current is multiplied by the current gain of the transistor. The apparent capacitance between the first and second terminals is equal to the capacitance of the capacitor multiplied by the current gain of the transistor.

3 Claims, 4 Drawing Figures

CAPACITANCE MULTIPLIER CIRCUIT

This is a continuation, of application Ser. No. 322,825, filed Feb. 15, 1973 now abandoned.

BACKGROUND OF THE INVENTION

Integrated circuits may be advantageously utilized in modern automotive electrical systems, for example, in ignition systems or in seat belt interlock systems, affording substantial cost savings. However, the automotive environment has been found to be an exceptionally harsh one for semiconductor circuits in general, and for integrated circuits in particular. As a result, unexpected problems and requirements have arisen in the design of integrated circuits which must perform reliably in automotive electrical systems and in other high-noise environments. A wide range of temperatures may occur in the automotive environment. Further, a wide range of spurious signals typically occur throughout the wiring of an automotive electrical system. For example, relatively low energy spurious signals of either positive or negative polarity having magnitudes of several hundred volts, hereinafter referred to as "noise" signals, typically occur on wiring lines connecting various sensors to input terminals of integrated circuit devices. Such noise signals may cause malfunctions in the operation of prior art integrated circuit devices, or may even cause destruction of them, and further may destroy discrete semiconductor devices such as power transistors controlled by the integrated circuit. Further, discontinuities in the main power lines of an automotive electrical system, such as interruptions in the connection to the 12 volt automobile battery, may cause severe, high-energy transient voltages, hereinafter called "load dump" voltages, of over 100 volts to occur on the main power lines. The load dump transient voltages may destroy the integrated circuit devices of the prior art in the absence of expensive external protective measures.

In prior art integrated circuit devices, capacitors have normally been either MOS (metal-oxide-silicon) capacitors or PN junction diffused capacitors. In either case, the amount of capacitance per unit area is relatively small, making it unfeasible to have large value capacitors on an integrated circuit chip. Thus, additional external terminals have been required so that discrete capacitances of the desired value could be utilized, adding to the cost both of components and of packages and requiring additional space. The present invention solves these problems of prior art devices for some applications by providing a capacitance multiplier circuit which multiplies the value of a capacitor on the chip by the common emitter current gain of a transistor for positive excursions of applied voltage.

SUMMARY OF THE INVENTION

In view of the foregoing considerations, it is an object of this invention to provide a capacitance multiplier circuit.

It is another object of this invention to provide a capacitance multiplier circuit including a capacitor and a current controlled current amplifier.

It is a further object of this invention to provide in an integrated circuit suitable for utilization in an automotive electrical system a capacitance multiplier device including a diffused capacitor or an MOS capacitor connected between the collector and base of a transistor.

Briefly described, the invention is a capacitance multiplier circuit having first and second terminals including a capacitor and a transistor, the capacitor being connected between the base and collector of the transistor. The collector of the transistor is connected to the first terminal and the emitter of the transistor is connected to the second terminal.

DESCRIPTION OF THE INVENTION

Figure 1:
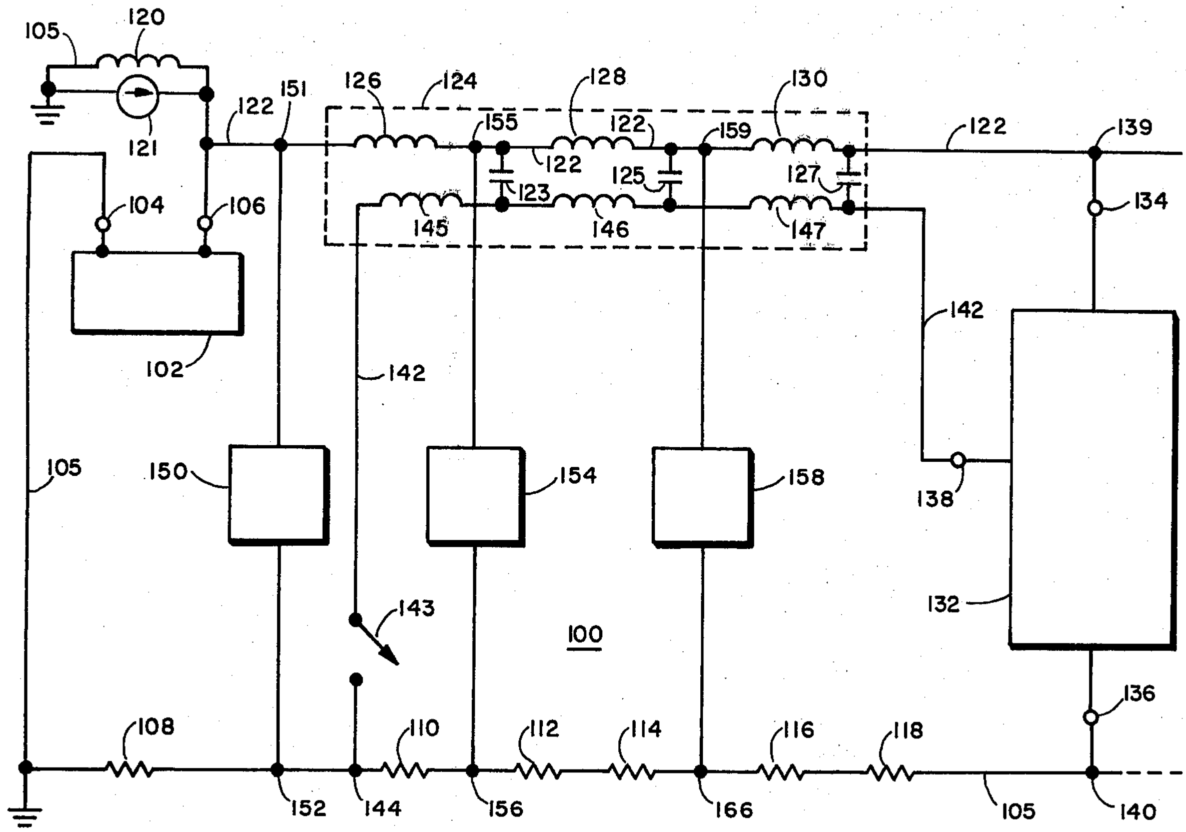
FIG. 1 is a schematic diagram of a model of the automotive electrical environment.

The environment giving rise to the problems solved by the present invention is best described with reference to FIG. 1, which is a schematic model of the automotive electrical environment, and also to FIG. 2, which is graph illustrating the noise and electrical transients occurring in the automotive electrical system of FIG. 1. In FIG. 1, automotive electrical system 100 includes a 12 volt battery 102, which has a negative terminal 104 and a positive terminal 106. Negative terminal 104 is connected to the electrical ground conductor 105 of the electrical system 100. The electrical ground conductor 105 includes the automobile chassis and wires connected to the chassis at various points thereof. In FIG. 1 the chassis resistance is lumped into several discrete resistors 108, 110, 112, 114, 116 and 118. It is known that these resistances may increase in value as corrosion of the chassis occurs and as mechanical conditions weaken various connections in the chassis as the automobile ages. Positive terminal 106 of battery 102 is connected to alternator field coil 120, and the alternator output, represented by current source 121, the other terminals of which are connected to the system ground. Power line 122, hereinafter referred to as the B+ bus, is also connected to positive terminal 106. B+ bus 122 runs through electrical wiring harness 124, along with numerous other wires of the electrical system. The distributed inductance of B+ bus 122 is lumped into several inductances 126, 128 and 130 in the model of FIG. 1. Integrated circuit 132, which has positive power supply terminal 134, ground supply terminal 136, and input terminal 138 is connected between B+ bus 122 at point 139 thereof and ground conductor 105 at point 140 thereof. Input terminal 138 is connected to wire 142 which runs through wiring harness 124 in close proximity to B+ bus 122 and is connected to switch 143. When switch 143 is closed, wire 142 is connected to ground conductor 105 at point 144 thereof. The distributed inductance of wire 142 is lumped into several inductors 145, 146 and 147. Lumped capacitors 123, 125, and 127 represent the capacitive coupling between B+ bus 122 and signal wire 142. Electrical accessory 150 is connected between point 151 of B+ bus 122 and point 152 of ground conductor 105. Second electrical accessory 154, which may, for example, be an air conditioner motor, is connected between point 155 of B+ bus 122 and point 156 of ground conductor 105. Third electrical accessory 158, which may, for example, be a motor operating an electric seat or electric window, is connected between point 159 of B+ conductor 122 and point 160 of ground conductor 105. The various inductances illustrated in FIG. 1 and the coupling therebetween gives rise to a large amount of electrical noise on wire 142 and B+ bus 122 as various electrical accessories are switched on and off. For example, if accessory 158 is operating, a large current flows from terminal 106 through B+ bus 122, inductors 126 and 128 and through resistors 114, 112, 110 and 108 to negative terminal 104. The resistances in ground conductor 105 are typically of sufficiently large values to cause a substantial drop in the ground voltage between point 160 and negative terminal 104. If accessory 158 is suddenly switched off, the change in current through inductors 126 and 128 causes a very large positive transient voltage to appear on point 159 and, also on point 139. Subsequently, a large positive voltage will appear between terminals 134 and 136 of integrated circuit 132. Further, mutual coupling between inductors 126 and 145 and also between inductors 128 and 146 will cause a large positive transient pulse to appear on wire 142 and hence on terminal 138 of integrated circuit 132, especially if switch 143 is open. Similarly, switching the other electrical accessories 150 and 154 on or off may cause positive or negative transient impulses to appear on B+ bus 122, and on terminal 134, and also on wire 142 and terminal 138. In general, it may be seen that any integrated circuit in the electrical system 100 connected distant from battery 102 between B+ bus 122 and ground conductor 105 will experience transient voltages to occur between terminals 134 and 136 when accessories are switched. It is also seen that there will be an uncertain ground reference voltage, due to currents flowing through the distributed resistances 108, 110, etc. Further, any input terminals connected to wires which run through the wiring harness 124 will pick up noise due to mutual inductive and capacitive coupling with B+ bus 122. Another type of noise distinct from that described may occur if the battery is disconnected from the positive terminal 106 while current is flowing through field coil 120. In this case, a high energy, positive transient voltage, called the "load dump" voltage, appears on B+ bus 122.

Figures 2, 3:
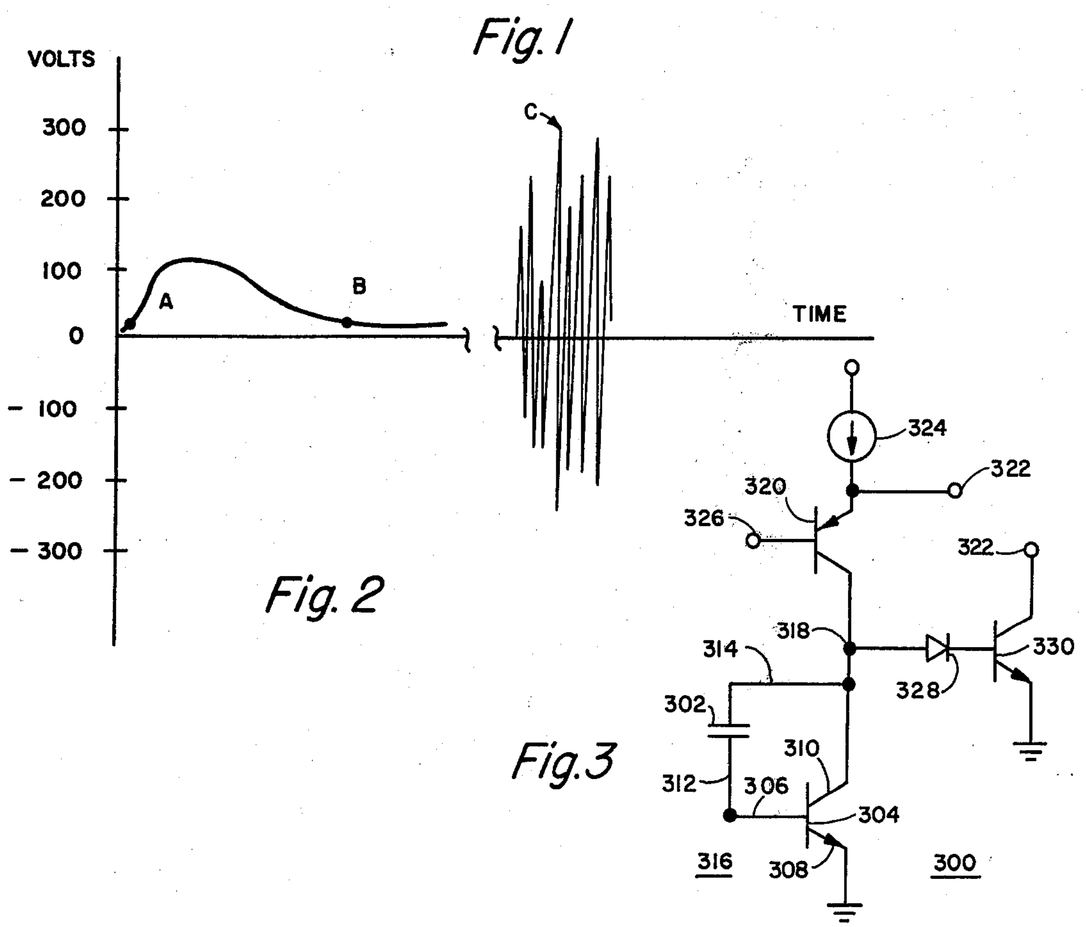
FIG. 2 is a graph illustrating a load dump transient voltage and electrical noise in an automotive electrical system.
FIG. 3 is a schematic diagram of an embodiment of the invention.

Both of the aforementioned types of voltage are illustrated in the graph of FIG. 2. The load dump voltage is illustrated on the lefthand portion of the horizontal axis between points A and B. As seen in FIG. 2, the magnitude of the load dump voltage may exceed 100 volts. The time duration between points A and B is typically half a second. This transient voltage on the B+ bus 122 is of sufficient magnitude and energy to destroy prior art integrated circuit devices and low cost discrete semiconductor components such as power transistors unless some method is employed to protect the integrated circuit. The waveform C illustrated on righthand portion of the graph in FIG. 2 represents high voltage, high frequency noise which may occur on B+ bus 122 and wire 142. The magnitude of the noise represented by waveform C may exceed 300 volts, and typically has a duration of approximately 1 to 50 microseconds. These pulses also have energy sufficient to sometimes destroy prior art integrated circuit devices.

A spectrum analysis of a noise waveform such as is shown in FIG. 2 further illustrates the presence of very high frequency component signals having magnitudes of several volts and frequencies as high as 100 megahertz. Since bipolar integrated circuits are generally high frequency circuits, they respond to such high frequency noise readily, and various precautions in the design of circuits for use in the automotive environment must be taken to insure that the circuits respond to information input rather than to such noise. Due to the high currents, which may be many amperes, which may flow through the chassis resistance, substantial voltage drops may occur in the ground conductor giving rise to a situation wherein a switch or sensor is referenced to a different ground voltage than the integrated circuit having an input terminal connected by a long wire to the switch or sensor.

Due to the incidence of high frequency noise in the automotive environment, it is desirable in order to prevent integrated circuits from responding to the noise to have filtering circuitry on the IC chips. However, to obtain adequate filtering, large values of resistance and capacitance are required. However, large values of capacitance and resistance are extremely costly on integrated circuit devices. The circuit shown in FIG. 3 illustrates a circuit which increases the effective capacitance of a capacitor having a capacitance of C picofarads by a factor of $\beta$, where $\beta$ is the common emitter current gain of an NPN transistor. The circuit 300 includes capacitor 302 and NPN transistor 304 having base electrode 306, emitter 308, and collector 310. Capacitor 302 has a first terminal 312 and a second terminal 314. Emitter 308 of transistor 304 is connected to ground, and base 306 is connected to terminal 312. Collector 310 is connected to capacitor terminal 314. If the voltage on collector 310 is increased by $\Delta V$, a current $I = C\Delta V/\Delta t$ will flow through capacitor 302, where C is the capacitance of capacitor 302, and $\Delta t$ is the time required for the voltage increment $\Delta V$ to occur. The current I flows into the base of transistor 304, and the current flowing through the collector 310 is $\beta C\Delta V/\Delta t$. Thus, the total current flowing through capacitor 302 and collector 310 is $(\beta+1)C\Delta V/\Delta t$. Thus, it is seen that capacitor 302 and transistor 304 as connected in FIG. 3 produce an equivalent capacitance between terminal 318 and ground having a value of $(\beta+1)C$ during a positive transition of a voltage applied to terminal 318, which is connected to terminal 314.

Also included in FIG. 3 is additional circuitry illustrating how capacitance multiplier 316 may function as a filtering device in an integrated circuit. PNP transistor 320 has its emitter electrode connected to external terminal 322, whereon both an information signal and a noise signal may occur. Transistor 320 has its collector connected to terminal 318 and its base 326 connected to an appropriate bias voltage source (not shown). Also shown in FIG. 3 are diode 328 and NPN transistor 330. The anode of diode 328 is connected to terminal 318 and its cathode is connected to the base of transistor 330, which has its emitter connected to ground and its collector connected to terminal 332, which may be connected to a following circuit stage (not shown). The operation is as follows. If a positive high frequency noise impulse is applied to external terminal 322, and exceeds the bias voltage on base 326 by a sufficient voltage, the current source 324 as well as current from an external noise source will flow into terminal 318, whereat it will have to charge the effective capacitance of capacitive multiplier 316 to activate transistor 330. Initially, if base 306 is at ground potential, the voltage of terminal of 318 will rise rapidly to approximately 0.75 volts (for silicon devices) until the emitter-base junction of transistor 304 becomes forward biased. Further increases in voltage at terminal 318 will have to charge an equivalent capacitance of $(\beta+1)C$ picofarads, rather than C picofarads, as in the prior art where capacitor C is simply connected between ground and the input of the succeeding stage. Thus, the noise signal needs to be of sufficiently long duration to allow the charging current to charge $(\beta+1)C$ picofarads from approximately 0.75 volts to 1.5 volts before transistor 330 will be driven into conduction. On the other hand, an information signal applied to terminal 322 is of sufficiently long duration to allow transistors 330 to be driven into conduction. Typical values for the value of C may be as high as 10 picofarads on a conventional IC, and typical values for $\beta$ maybe higher than 100, so it is seen that the invention provides an equivalent capacitance of as high as 1,000 picofarads. Such a high value is unattainable in integrated circuits in the prior art.

Figure 4:
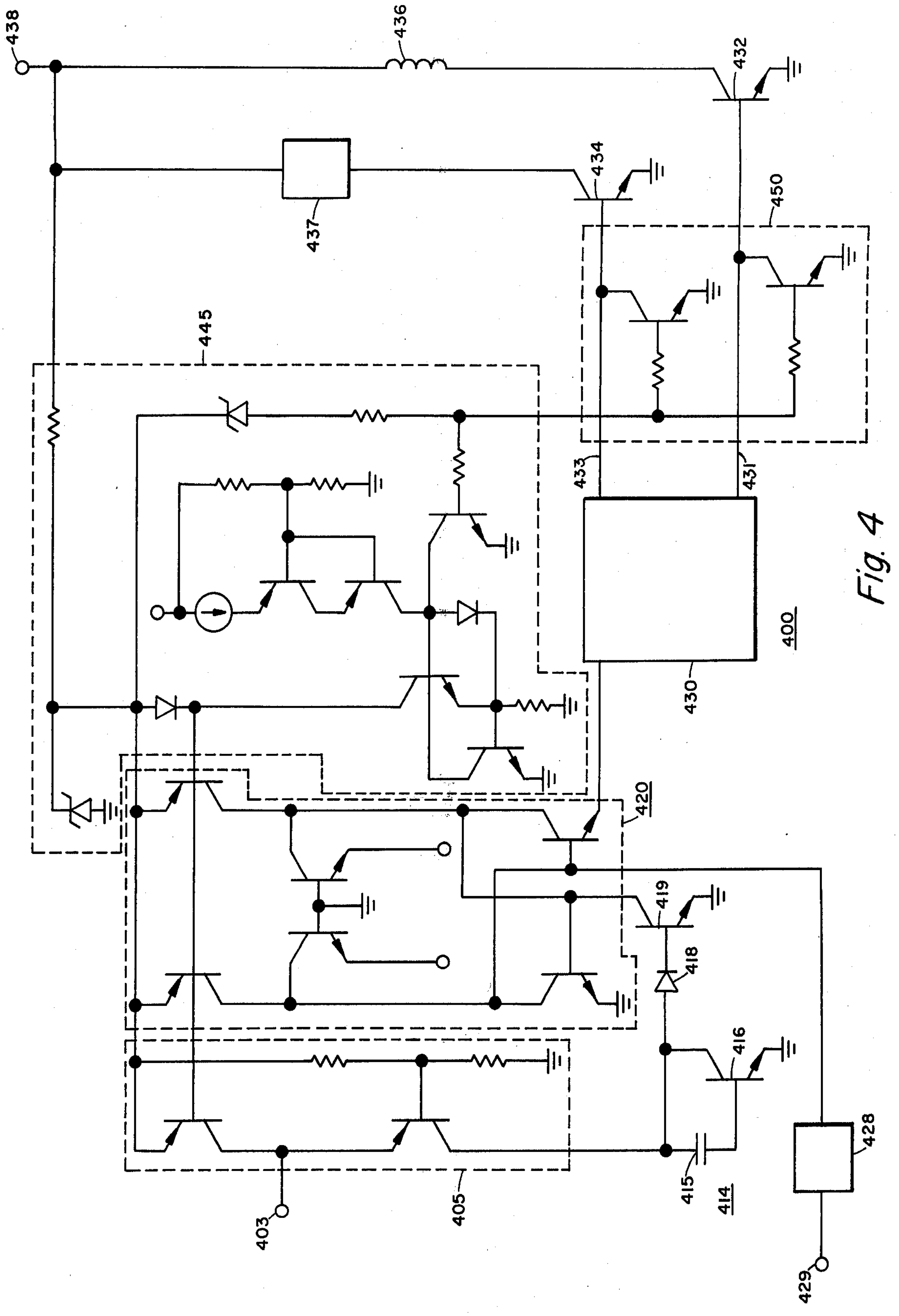
FIG. 4 is a schematic diagram illustrating an embodiment of the invention in an automotive electrical system.

FIG. 4 is a schematic diagram of another embodiment of the invention. In FIG. 4, integrated circuit 400 includes interface circuit 405 having input terminal 403 connected thereto. Interface circuit 405 converts a suitable voltage signal on input terminal 403 into a current signal on an output node connected to capacitance multiplier 414. Integrated circuit 400 of FIG. 4 corresponds to integrated circuit 132 of FIG. 1, and terminal 403 in FIG. 4 corresponds to terminal 138 in FIG. 1. Capacitance multiplier circuit 414 includes a capacitor 415 and an NPN transistor 416 having its collector connected to interface circuit 405. Capacitor 415 is connected between the collector and base of transistor 416, which has its emitter connected to ground. The equivalent capacitance which must be charged by current from interface circuit 405 is equal to the capacitance of capacitor 415 multiplied by the common-emitter current gain $\beta$ of transistor 416. The effect of capacitance multiplier circuit 414 in this embodiment is to provide in a very small area a filtering capacitor to prevent the high frequency noise signals which pass through interface circuit 405 from biasing diode 418 and transistor 419 into conduction, thereby preventing the state of flip-flop 420 from being incorrectly changed in response to such high frequency noise signals.

Integrated circuit 400 further includes a second input terminal 429 which is connected to circuit 428. Circuit 428 may include an interface circuit and a capacitance multiplier circuit similar in structure and operation to circuits 405 and 414, respectively.

Flip-flop 420 is connected to the collector of transistor 419 and to circuit 428, and stores a logical state representative of signals occurring on input terminals 403 and 429.

The output of flip-flip 420 is connected to circuit 430, which senses the information stored on flip-flop 420 and converts it to signals to control output transistors 432 and 434. As an example, integrated circuit 400 may be part of an automotive seat belt interlock system, wherein terminal 403 has applied thereto a seat input signal from the automobile driver seat indicating whether or not the driver has his weight on the seat.

Terminal 429 may be an input signal from the seat belt indicating whether or not the seat belt is fastened. With no driver in the driver seat of the automobile, and with the seat belt unfastened, both the seat input and the belt input are ungrounded. When the driver puts his weight on the seat, the seat input 403 is grounded. Then, when the seat belt is buckled, the belt input is grounded, and circuits 505, 514, and 528 act to cause a "1" to be stored in the flip-flop. If the order of buckling the seat belt and placing the driver's weight on the seat are reversed, a "0" is written into the flip-flop. The state of the flip-flop is detected through the emitter of transistor 422 by circuit 430, which produces drive current through terminal 431 to turn on output transistor 432 if the seat input 403 and the belt input 429 are properly grounded. If the seat input and belt input are not grounded in the proper sequence, and a "0" is stored, then circuit 430 provides base current only through terminal 433 to output transistor 434. Output transistor 432 enables the starting relay 436 if a "1" is stored in flip-flop 420. On the other hand, output transistor 434 is turned on, thereby activating warning buzzer 437 if a "0" is stored in flip-flop 420.

Circuits 445 and 450 include circuitry for establishing reference voltages for various current source devices in integrated circuit 400, and further include circuitry for protecting transistors 432 and 434 and other transistors in integrated circuit 400 from overvoltages on B+ bus 438.

In summary, the invention described herein provides a capacitive multiplier circuit which provides an apparent capacitance equal to the value of a capacitor multiplied by the gain of a current controlled current amplifier.

Although this invention has been illustrated and described in relation to several specific embodiments thereof, those skilled in the art will readily recognize that variations in placement of parts may be made to suit specific requirements without departing from the spirit and scope of the invention.

I claim:

1. An integrated circuit filtering circuit on a monolithic semiconductor integrated circuit chip having an input for filtering high frequency signal components from a signal applied to said input comprising:

a first input transistor having a base connected to bias circuit, means for establishing a bias threshold voltage at said base at said first input transistor an emitter connected to said input, and a collector;

capacitance multiplier circuit means connected to said collector of said first input transistor for multiplying the effective capacitance of an integrated capacitor of said capacitance multiplier circuit means by approximately the current gain of a second transistor of said capacitance multiplier circuit means and providing a filtered signal at said collector of said first input transistor, said integrated circuit capacitor having first and second nodes thereof, said second transistor having a base, a collector, and an emitter, said first node of said integrated capacitor being connected to a collector of said first input transistor and said second transistor and the second node of said integrated capacitor being connected only to the base of said second transistor so as to forward bias the emitter-base junction of said second transistor in response to a signal applied at said input; and a current source coupled between a voltage conductor and said input.

2. The integrated circuit filtering circuit as recited in claim 1 further including a diode and a third transistor having a base, a collector, and an emitter, the anode of said diode being connected to the collector of said second transistor, the cathode of said diode being connected to the base of said third transistor, said third transistor having its emitter connected to the emitter of said second transistor, said diode and said third transistor producing a filtered signal at said collector of said third transistor.

3. The integrated circuit filtering circuit as recited in claim 2 wherein said second and third transistors are NPN transistors and said first input transistor is a PNP transistor.

* * * * *